(12) United States Patent
Karpov et al.

(10) Patent No.: US 7,863,596 B2
(45) Date of Patent: Jan. 4, 2011

(54) RING HEATER FOR A PHASE CHANGE MEMORY DEVICE

(75) Inventors: Ilya V. Karpov, Santa Clara, CA (US); Sergey Kostylev, Bloomfield Hills, MI (US); Charles C. Kuo, Union City, CA (US)

(73) Assignee: STMicroelectronics S.r.l., Agrate Brianza (IT)

( * ) Notice: Subject to any disclaimer, the term of this patent is extended or adjusted under 35 U.S.C. 154(b) by 128 days.

(21) Appl. No.: 11/531,800

(22) Filed: Sep. 14, 2006

(65) Prior Publication Data

US 2008/0067486 A1 Mar. 20, 2008

(30) Foreign Application Priority Data

Sep. 14, 2005 (EP) .................................. 05108413

(51) Int. Cl.
*H01L 47/00* (2006.01)
(52) U.S. Cl. .................... 257/3; 257/4; 257/5; 438/409
(58) Field of Classification Search .................. 257/3
See application file for complete search history.

(56) References Cited

U.S. PATENT DOCUMENTS 7,135,696 B2 * 11/2006 Karpov et al. .................. 257/2
2003/0164515 A1 * 9/2003 Xu .............................. 257/296
2004/0012009 A1 1/2004 Casagrande et al.
2005/0121659 A1 6/2005 Tanaka et al.
2005/0127348 A1 6/2005 Horak et al.
2005/0139816 A1 6/2005 Jeong et al.
2005/0167656 A1 8/2005 Sun et al.
2008/0012094 A1 * 1/2008 Ma et al. ..................... 257/614

FOREIGN PATENT DOCUMENTS

EP 1339110 A1 8/2003
WO 2004057676 A2 7/2004

* cited by examiner

Primary Examiner—Thanh V Pham
Assistant Examiner—Tony Tran
(74) Attorney, Agent, or Firm—Lisa K. Jorgenson; Robert Iannucci; Seed IP Law Group PLLC

(57) ABSTRACT

A ring shaped heater surrounds a chalcogenide region along the length of a cylindrical solid phase portion thereof defining a change phase memory element. The chalcogenide region is formed in a sub-lithographic pore, so that a relatively compact structure is achieved. Furthermore, the ring contact between the heater and the cylindrical solid phase portion results in a more gradual transition of resistance versus programming current, enabling multilevel memories to be formed.

25 Claims, 5 Drawing Sheets

RING HEATER FOR A PHASE CHANGE MEMORY DEVICE

BACKGROUND OF THE INVENTION

1. Field of the Invention

Figure 1:
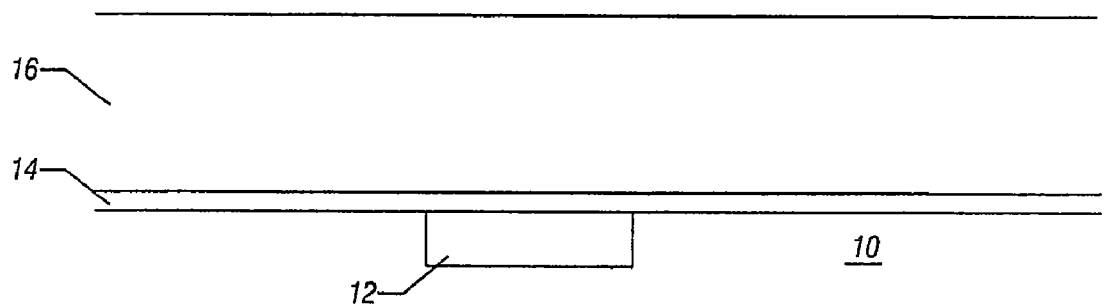

The present invention relates generally to multilevel phase change memory, and in particular to a ring heater for a phase change memory device.

2. Description of the Related Art

Phase change memory devices use phase change materials, i.e., materials that may be electrically switched between a generally amorphous and a generally crystalline state, for electronic memory application. One type of memory element utilizes a phase change material that may be electrically switched between a structural state of generally amorphous local order and a structural state of generally crystalline local order or among different detectable states of local order across the entire spectrum between completely amorphous and completely crystalline order. The state of the phase change materials is also non-volatile in that, when set in either a crystalline, semi-crystalline, amorphous, or semi-amorphous state representing a resistance value, that phase or physical state and the resistance value associated thereto are retained until changed by another programming event. The state is unaffected by removing electrical power.

A multilevel phase change memory is capable of being programmed to more than the two conventional states, termed set and reset. In order to form the multilevel memory, it is desirable to provide a cell which is capable of being gradually programmed so that more than two programmable states can be provided. This generally means that the plot of resistance versus current for the cell should have a gradual slope.

BRIEF SUMMARY OF THE INVENTION

On embodiment of the invention provides a phase change memory and the manufacturing process thereof that allows a multilevel programming. One embodiment of the present invention is a method of manufacturing a phase change memory device comprising the steps of forming a phase change region and surrounding the phase change material with a heater.

One embodiment of the invention is a phase change memory comprising a sub-lithographic pore, a chalcogenide region in said pore, and a heater surrounding the chalcogenide region.

One embodiment of the invention is a system comprising a controller, a static random access memory connected to said controller, and a phase change memory. The phase change memory includes a sub-lithographic pore, a chalcogenide region in said pore, and a heater surrounding said chalcogenide region.

BRIEF DESCRIPTION OF THE SEVERAL VIEWS OF THE DRAWING(S)

Figure 10:
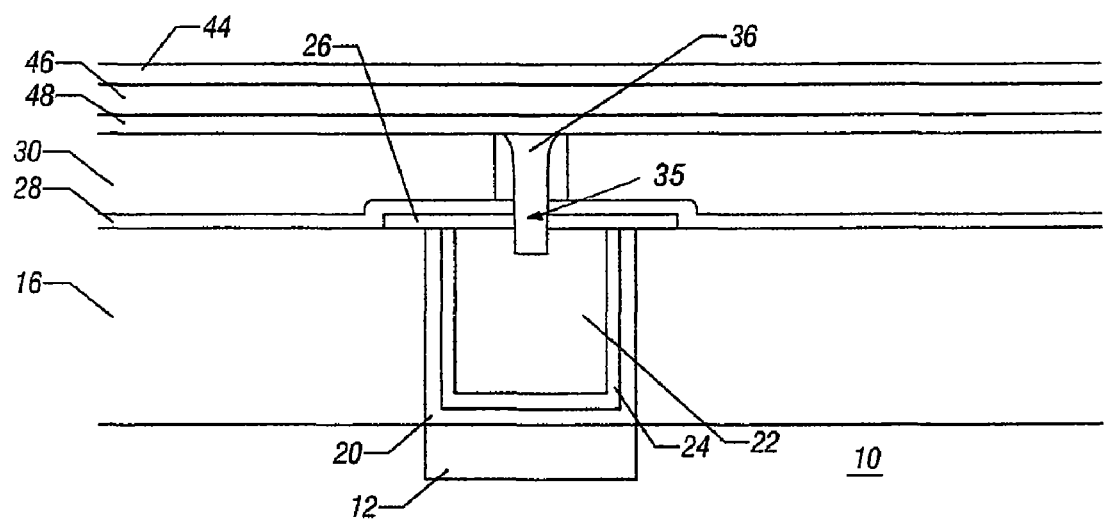
Figure 11:
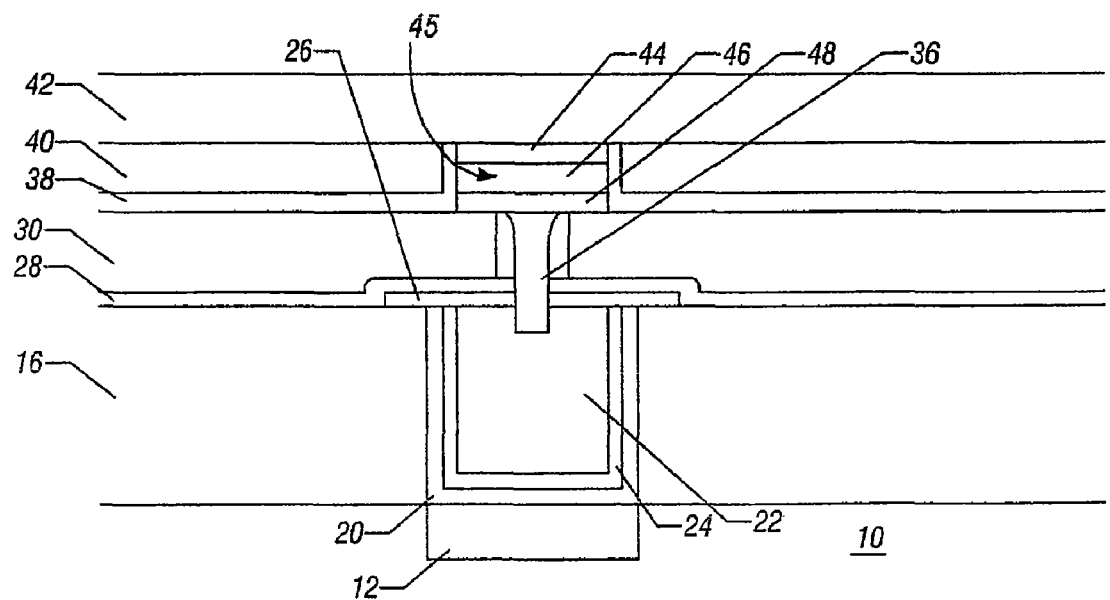
Figure 12:
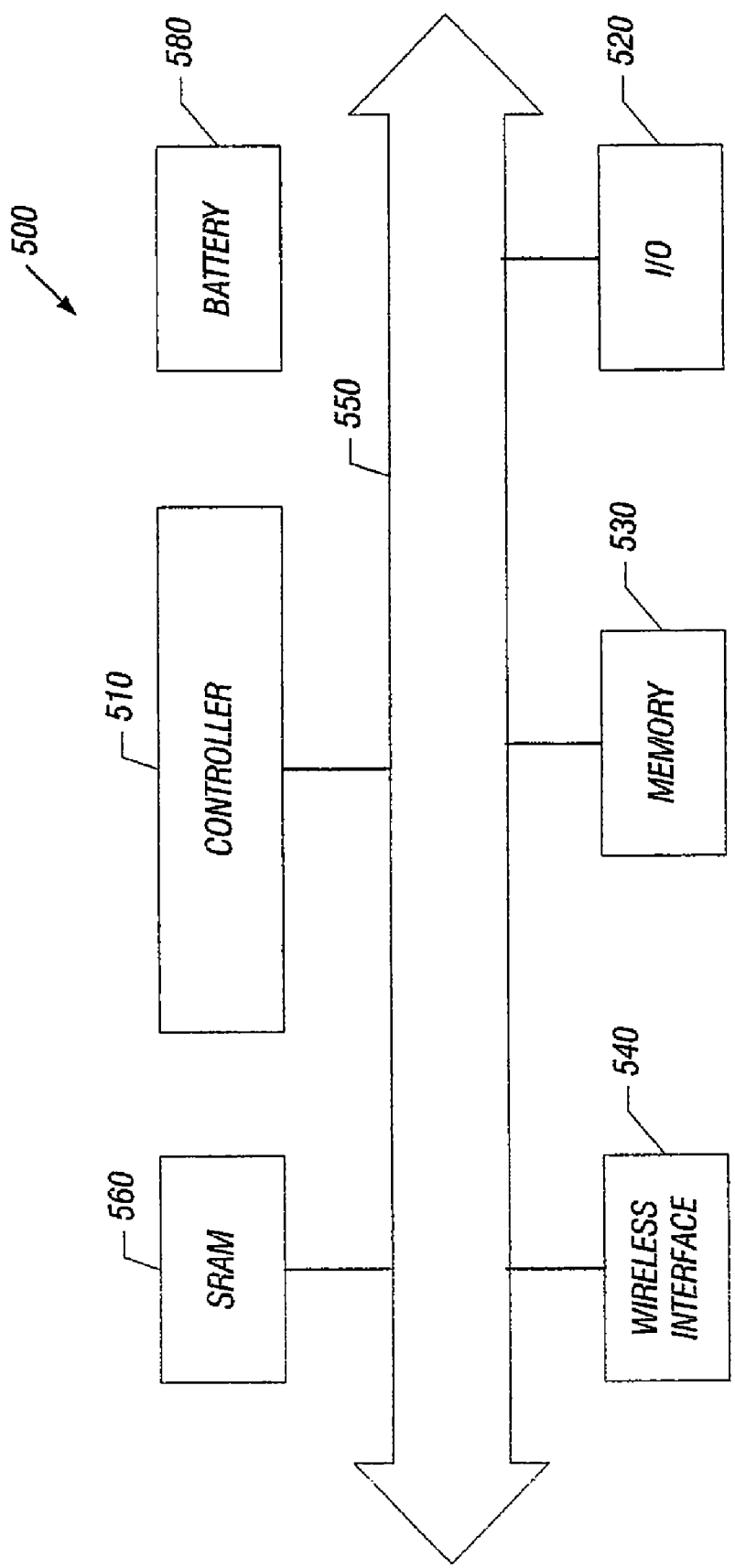

For the understanding of the present invention, a preferred embodiment is now described, purely as a non-limitative example, with reference to the enclosed drawings, wherein:

FIGS. 1-11 are enlarged, cross-sectional views at subsequent manufacture stages of a phase change memory, in accordance with one embodiment of the present invention; and FIG. 12 is a depiction of a schematic system incorporating the memory of FIG. 1.

DETAILED DESCRIPTION OF THE INVENTION

FIGS. 1-11 show cross-sections of a semiconductor wafer at subsequent manufacture stages of a multilevel phase change memory. In particular, the memory is capable of being programmed to more than the two conventional states, termed set and reset.

To obtain a sufficiently gradual slope, the chalcogenide structure is heated using a surrounding ring-shaped heater. Therefore, the heater only converts a ring-shaped region within the intervening chalcogenide. As a result, more gradual programming can be achieved.

Hereinafter, the ring-shaped region of the chalcogenide will be also termed "cylindrical solid". As used herein, the terms "ring-shaped" and "cylindrical solid" are not intended to be limited to circular structures, but to also include any three-dimensional structures definable by a straight line intersecting and moving along a closed plane curve. It is not necessary that the height or vertical dimension of such cylindrical solids be greater than the width or horizontal dimension.

Referring to FIG. 1, the fabrication of a phase change memory cell begins by forming a lower address line 12 within an interlayer dielectric 10. The interlayer dielectric 10 may be situated over a semiconductor substrate (not shown). The lower address line 12 is here a row line and may be made by conventional fabrication techniques in which a copper metallization is formed within the interlayer dielectric 10.

The interlayer dielectric 10 and address line 12 are covered by a first insulating layer 14, e.g., of silicon nitride and the first insulating layer 14 is covered by a second insulating layer 16 of, e.g., silicon dioxide.

Figure 2:
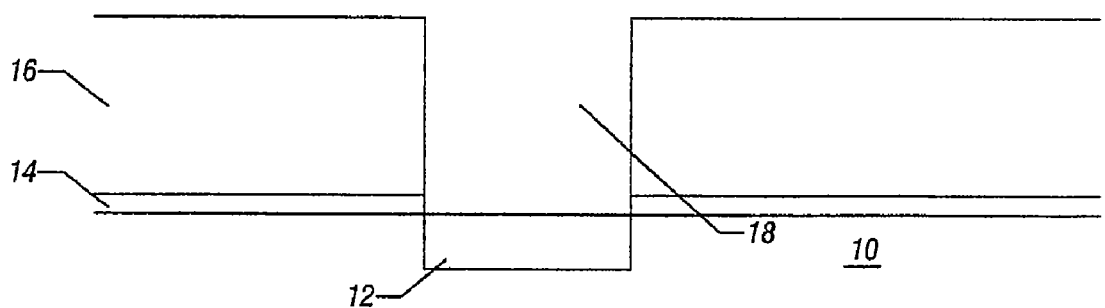
Figure 3:
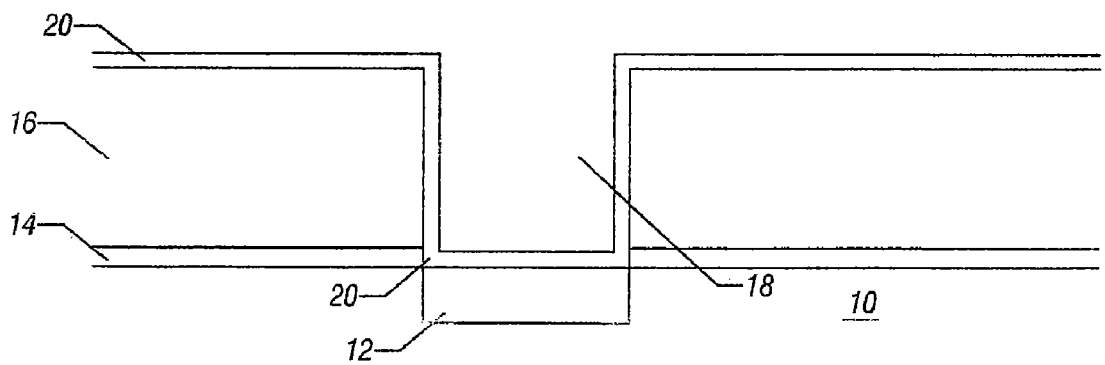

A trench or pore 18 is then formed through the insulating layers 16 and 14, down to the address line 12, as shown in FIG. 2. Then, the pore 18 is partially coated with a metallic layer 20 as shown in FIG. 3. The metallic layer 20 covers the second insulating layer 16 and the address line 12 at the bottom of the pore 18, as well. The metallic layer 20 forms a conductive line and is, e.g., formed of a conductive metal such as tungsten.

Figure 4:
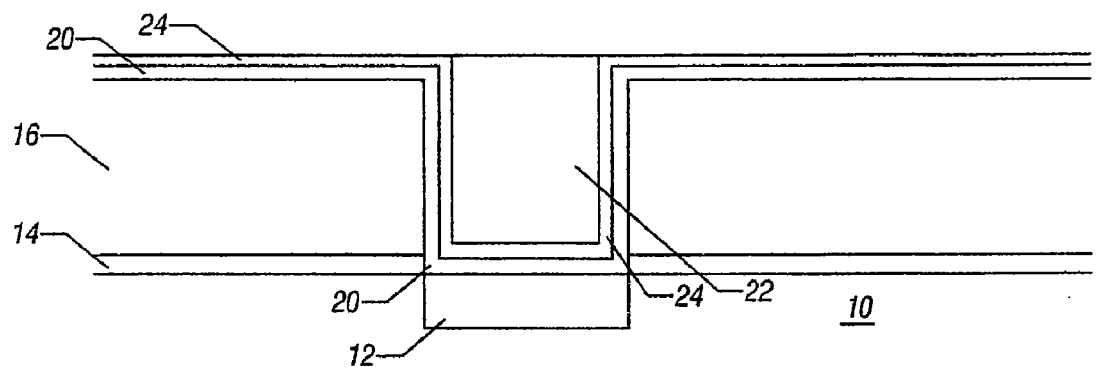

As shown in FIG. 4, a third insulating layer 24 is formed over the metallic layer 20. The third insulating layer 24, e.g., of nitride, prevents oxidation of the metallic layer 20. A filler 22, of insulating material, is deposited in the remaining pore 18. The filler 22 may be an oxide, in which case the third insulating layer 24 is advantageous to prevent oxidation of the metallic layer 20 during oxide formation.

Figure 5:
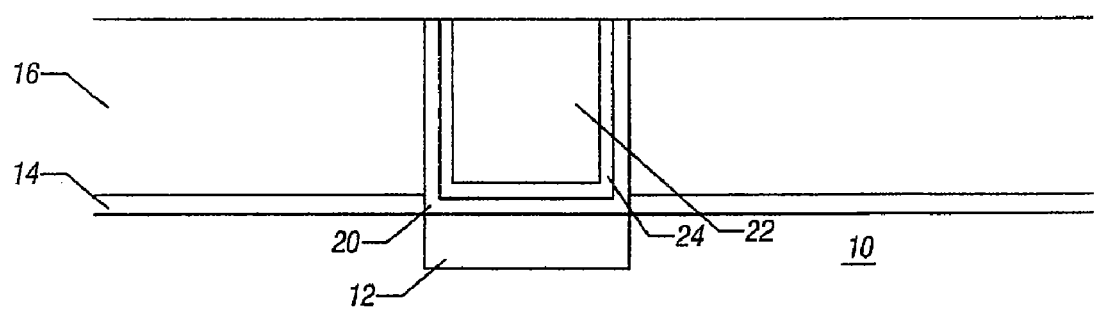

The structure then is planarized to remove the upper horizontal portions of the metallic layer 20, the insulating layer 24, and part of the filler 22, forming the structure shown in FIG. 5. E.g., a chemical mechanical planarization (CMP) may be used and stopped on the second insulating layer 16.

Figure 6:
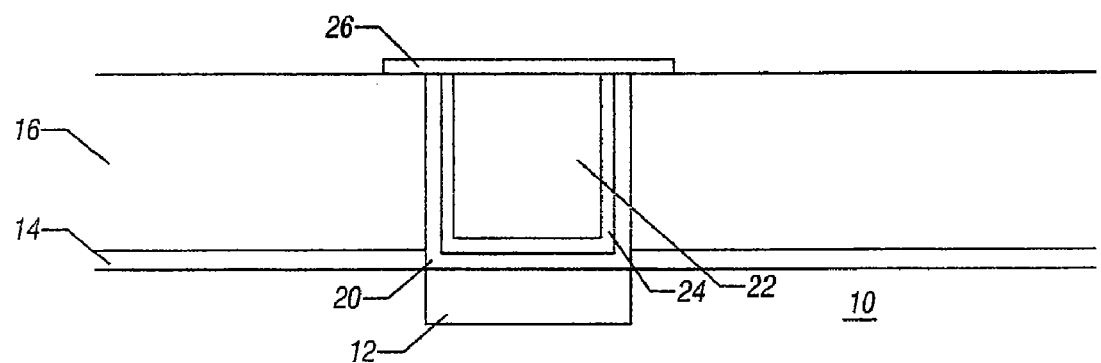

Then, a heater 26 of a high resistivity metallic material is deposited and patterned as shown in FIG. 6. An anneal treatment is performed to stabilize the heater 26 and to make the resulting heater 26 insensitive to so-called "first fire", that is the effects of the first electrical pulses. The heater 26 is, e.g., formed of titanium silicon nitride which may be sputter deposited. The heater may be patterned in a dot pattern which essentially is a small square or rectangle.

Figure 7:
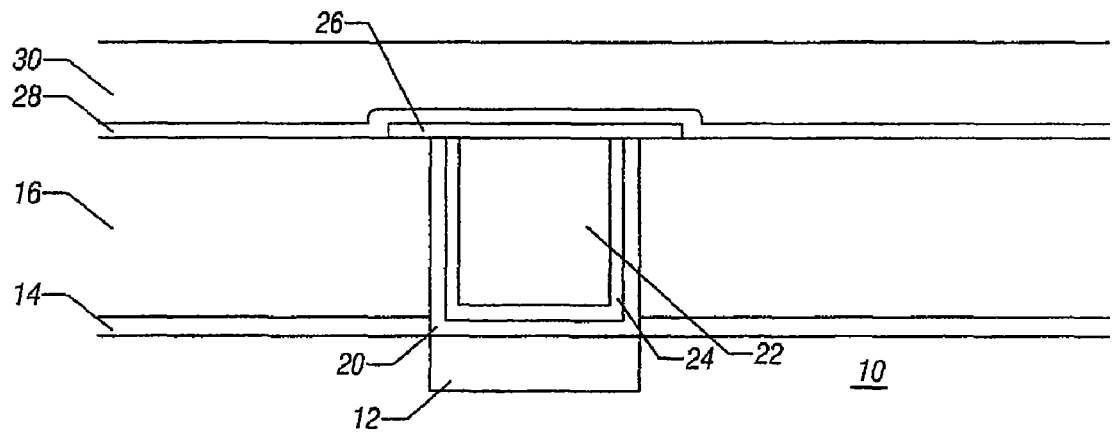

Then, a fourth insulating layer 28, such as nitride, is deposited as a buffer before a fifth insulating layer 30, e.g., of oxide, as shown in FIG. 7. The layer 30 may be deposited as well. Again, the fourth insulating layer 28 advantageously prevents oxidation of the heater 26 during the formation of the fifth insulating layer 30 while also serving as a nitride etch stop layer.

Figure 8:
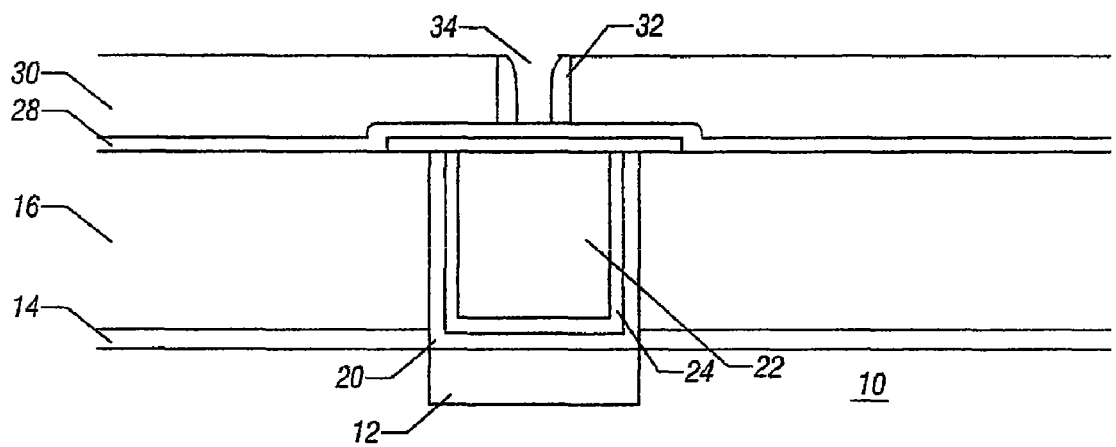

As shown in FIG. 8, a memory pore 34 is formed through the layer 30 down to the fourth insulating layer 28. A sidewall spacer 32 is formed therein. For example, the sidewall spacer 32 is formed of deposited nitride material which is subjected to an anisotropic etch. As a result, the memory pore 34 is reduced to sub-lithographic horizontal dimension. As used herein, "sub-lithographic" means less than the size possible with lithographic techniques, generally about 180 nanometers.

Figure 9:
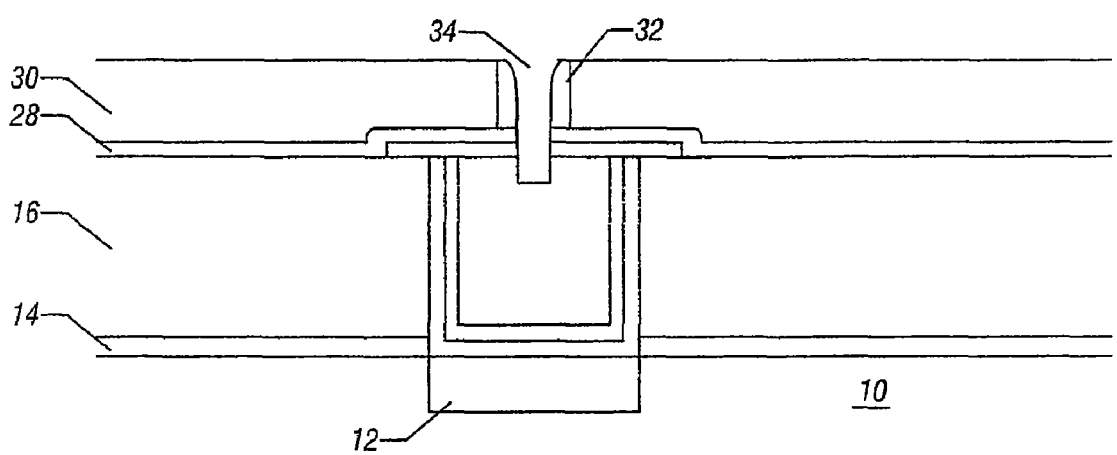

A metal etch is implemented to deepen the memory pore 34, as shown in FIG. 9. The etch proceeds through the fourth insulating layer 28 and the heater 26 and into the filler 22.

Then, as shown in FIG. 10, a memory material, e.g., a chalcogenide material 36, such as GST (e.g., $Ge_2Sb_2Te_5$) is deposited and planarized, to form a cylindrical solid. A closed peripheral edge of the heater 26 contacts a cylindrical edge portion of the chalcogenide material 36. Thus, the memory cell has a planar heater 26 which extends transversely to the chalcogenide material 36 and the heater 26 and chalcogenide material 36 intersect along a circular ring of contact. As a result of the peripheral contact, a ring-shaped region of the chalcogenide material 36, defining a memory element 35, can be converted between set, reset, and intermediate phases in a multilevel memory.

Next, a first conductive layer 48, a chalcogenide layer 46, and a second conductive layer 44 are successively deposited, patterned and etched to form an island or dot structure defining an access or select device 45. The access device 45, shown in FIG. 11, is here a so-called ovonic threshold switch (OTS). In the access device 45, the chalcogenide layer 46 is permanently in an amorphous phase and the access device 45 does not change phase. However, other access devices, including a chalcogenide containing a non-ovonic threshold switch, a plurality of ovonic threshold switches, a diode, an MOS transistor, or a bipolar transistor may be utilized as the access device 45.

Thereafter, an encapsulation layer 38 is deposited to protect the sidewalls of the chalcogenide material 46. The encapsulation layer 38 is, for example, a nitride layer. Then, a sixth insulating layer 40, such as oxide, is deposited. The structure is planarized and then an upper address line 42 is deposited, patterned, and etched, see FIG. 11. The upper address line 42 corresponds to a column line in a memory array.

Thus, an edge ring memory device is arranged vertically so that a small and compact cell can be fabricated. The edge ring memory device provides a small contact area to the phase change material 36, thereby providing a multilevel programming capability based on a gradual change in resistance versus programming current. The bulk of the heater 26 may be annealed to make the heater insensitive to the first fire effects.

The access device 45 is used to access memory element 35 during programming or reading of the memory element 35. The access device 45 is here an ovonic threshold switch (OTS) made of a chalcogenide alloy that does not exhibit an amorphous to crystalline phase change and that undergoes rapid, electric field-initiated change in electrical conductivity that persists only so long as a holding voltage is present. An OTS may operate as a switch that is either "off" or "on" depending on the amount of voltage potential applied across the memory cell (comprising the access device 45 and the memory element 35), and more particularly on whether the current through the access device 45 exceeds the threshold current or voltage thereof, which then triggers the access device 45 into the on state. The off state is a substantially electrically nonconductive state and the on state is a substantially conductive state, with less resistance than the off state. In the on state, the voltage across the OTS is equal to its holding voltage VH plus IxRon, where I is the current flowing through the OTS and Ron is the dynamic resistance from VH. For example, the OTS has a threshold voltage and, if a voltage potential less than the threshold voltage of the OTS is applied across the OTS, then the OTS remains "off" or in a relatively high resistive state so that little or no electrical current passes through the memory cell and most of the voltage drop from the selected row to the selected column is across the OTS.

Alternatively, if a voltage potential greater than the threshold voltage of the OTS is applied across OTS, then the OTS "turns on," i.e., operates in a relatively low resistive state so that electrical current passes through the memory cell. In other words, the OTS is in a substantially electrically nonconductive state if less than a predetermined voltage potential, e.g., the threshold voltage, is applied across the OTS. The OTS is in a substantially conductive state if greater than the predetermined voltage potential is applied across the OTS.

In the described embodiment, the chalcogenide layer 46 comprises a switching material in a substantially amorphous state positioned between conductive layers 44, 48 defining two electrodes so as to be repeatedly and reversibly switched between a higher resistance "off" state (e.g., greater than about ten megaOhms) and a relatively lower resistance "on" state (e.g., about one thousand Ohms in series with its holding voltage) by application of a predetermined electrical current or voltage potential. In this embodiment, the OTS is a two terminal device that has a current-voltage (I-V) characteristic similar to a phase change memory element that is in the amorphous state. However, unlike a phase change memory element, the chalcogenide layer 46 may not change phase. That is, the switching material of the OTS is not a programmable material, and, as a result, the OTS is not a memory device capable of storing information. For example, the switching material of the OTS remains permanently amorphous and the I-V characteristic remains the same throughout the operating life.

The chalcogenide layer 46 may include an alloy of arsenic (As), tellurium (Te), sulfur (S), germanium (Ge), selenium (Se), and antimony (Sb) with respective atomic percentages of 10%, 21%, 2%, 15%, 50%, and 2%. Although the scope of the present invention is not limited in this respect, in other embodiments, chalcogenide layer 24 may include Si, Te, As, Ge, sulfur (S), and selenium (Se). As another example, the composition of the chalcogenide layer 24 may comprise a Si concentration of about 5%, a Te concentration of about 34%, an As concentration of about 28%, a Ge concentration of about 11%, a S concentration of about 21%, and a Se concentration of about 1%.

In the low voltage or low electric field mode, i.e., where the voltage applied across the OTS is less than a threshold voltage, the OTS is "off" or non-conducting, and exhibits a relatively high resistance, e.g., greater than about 10 megaOhms. The OTS remains in the off state until a sufficient voltage VTH or a sufficient current ITH is applied, that switches the OTS to a conductive, relatively low-resistance on-state. After a voltage potential greater than about VTH is applied across the OTS, the voltage potential across the OTS drops ("snapback") to a holding voltage potential (VH). Snapback refers to the voltage difference between VTH and VH of a select device.

In the on state, the voltage potential across the OTS remains close to the holding voltage as current passing through the OTS is increased. The OTS remains on until the current through the OTS drops below a holding current. Below this value, the OTS turns off and returns to a relatively high-resistance, nonconductive off-state until the VTH and ITH are exceeded again.

Programming of chalcogenide material 36 to alter the state or phase of the material may be accomplished by applying voltage potentials to conductive lines 12 and 42, thereby generating a voltage potential across the access device 45 and the memory element 35. When the voltage potential is greater than the threshold voltage of the access device 45 and memory element 35, then an electrical current flows through the chalcogenide material 36 in response to the applied voltage potentials, and results in heating the memory material (chalcogenide material 36).

This heating may alter the memory state or phase of the memory material. Altering the phase or state of memory material alters the electrical characteristic of memory material, e.g., the resistance of the material is altered by altering the phase of the memory material. Thus, memory material may also be referred to as a programmable resistive material.

In the "reset" state, the memory material is in an amorphous or semi-amorphous state and in the "set" state, memory material is in a crystalline or semi-crystalline state. The resistance of memory material in the amorphous or semi-amorphous state is greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature crystallizes memory material and "sets" memory material (e.g., program memory material to a logic "1" value). Various resistances of memory material may be achieved to store information by varying the amount of current flow and duration through the volume of memory material.

In multi-level cell (MLC) operation, a phase change material is used to exhibit multiple states to store multiple bits of data, wherein changing the state of a phase change material having more than two states is accomplished by changing the resistivity/conductivity of the phase change material. For purposes of illustration, the embodiments herein describe binary systems that store 2-bits per memory cell using four states. A (0,0) state is e.g., defined as a substantially amorphous (high resistivity) state; a (1,1) state is e.g., defined as a substantially crystalline (low resistivity); and a (0,1) state and a (1,0) state are intermediate states between the substantially amorphous and substantially crystalline states. These intermediate states may be referred to as heterogeneous states. In addition, the substantially amorphous state may also be referred to as a relatively amorphous state or a generally amorphous state and the substantially crystalline state may be referred to as a relatively crystalline state or a generally crystalline state. In the four state example, the four states of the phase change material may be defined to have the following resistive relationship: the resistance of the phase change material in state (0,0) is greater than the resistance of the phase change material in state (0, 1); the resistance of the phase change material in state (0, 1) is greater than the resistance of the phase change material in state (1,0); and resistance of the phase change material in state (1,0) is greater than the resistance of the phase change material in state (1, 1).

Although a binary 2-bit per cell system is described for purposes of illustration, the invention is not limited in this respect.

Programming is carried out by supplying the cell to be programmed with a programming signal that is shaped by setting the fall time so that the decaying or sloping trailing portion of the programming signal cools the phase change memory material at a rate sufficient to place the memory cell in a desired state. For example, the fall time of the programming signal applied to a phase change material is increased to reduce the resistance of the phase change material, and conversely, the fall time of the programming signal is decreased to increase the resistance of the phase change material.

In some embodiments, an amplitude of a programming signal is set to an amplitude sufficient to heat the phase change material of a memory cell to an amorphizing temperature and place the phase change material in a substantially amorphous state. To keep the phase change material in the substantially amorphous state, the material is rapidly cooled. This is accomplished by having a relatively fast fall time for the applied programming signal.

Alternatively, to place the phase change material in a polycrystalline state so that the phase change material has a relatively low resistance, the amplitude of the programming signal is set to an amplitude sufficient to heat the phase change material to an amorphizing temperature, and set a fall time of the programming signal so that after the memory material reaches the amorphizing temperature, the phase change memory material cools down at a sufficient rate so that the memory material is placed in the polycrystalline state.

As may be appreciated from the preceding discussion, application of signals having different amplitudes, durations and fall times heats and cools the phase change materials of memory cells to set the resistance of the phase change materials, thereby setting the state of the associated memory cell. In other words, the duration and amplitude of programming are selected so as to set the resistance of a phase change material to a desired resistance. In addition, the fall time of a signal is controlled to set the resistance of a phase change material to a desired resistance.

Turning to FIG. 12, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that are adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 includes a controller 510, an input/output (I/O) device 520 (e.g., a keypad, display), a memory 530, a static random access memory (SRAM) 560, and a wireless interface 540 coupled to each other via a bus 545. The system 500 is powered by the battery 580. It should be noted that the scope of the present invention is not limited to embodiments having any or all of these components.

Controller 510 comprises, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 860, and may be used to store user data. Memory 530 comprises the phase change memory having a memory array formed by the phase change cells discussed herein.

I/O device 520 may be used by a user to generate a message. System 500 uses wireless interface 540 to transmit and receive messages to and from a wireless communication network with a radio frequency (RF) signal. Examples of wireless interface 540 include an antenna or a wireless transceiver.

Finally, it is clear that numerous variations and modifications may be made to the phase change memory and process described and illustrated herein, all falling within the scope of the invention as defined in the attached claims.

The invention claimed is:

1. A phase change memory comprising:
   a heater having a sub-lithographic pore extending through the heater, the sub-lithographic pore being defined by an inner wall of the heater; and
   a chalcogenide region extending completely through said pore and having an outer wall that contacts the inner wall of the heater, wherein the heater is configured to supply heat to the chalcogenide region via the inner wall of the heater.

2. The memory of claim 1 wherein said memory is a multilevel memory.

3. The memory of claim 1, wherein the chalcogenide region includes an upper portion extending above the heater, the phase change memory further including a plurality of sidewall spacer portions contacting opposite sides of the upper portion of said chalcogenide region.

4. The memory of claim 1 wherein said heater is planar.

5. The memory of claim 1, including:
   a conductive tube extending under and contacting said heater; and
   an insulating filler extending in said conductive tube.

6. The memory of claim 5, including an address line extending under and electrically coupled to said conductive tube.

7. The memory of claim 1 including an ovonic threshold switch coupled to the chalcogenide region.

8. The memory of claim 7 wherein said ovonic threshold switch is over said sub-lithographic pore and is electrically connected to said chalcogenide region.

9. The memory of claim 1, wherein said chalcogenide region is less than 180 nanometers wide.

10. The memory of claim 1, wherein at least a portion of the chalcogenide region extends through and beyond an adjacent portion of the heater.

11. The memory of claim 1, wherein the chalcogenide region extends past a portion of the heater laterally contacting the chalcogenide region.

12. The memory of claim 1, wherein the heater has an upper side and a lower side opposing the upper side, the chalcogenide region extends outwardly from both the upper side and the lower side.

13. The memory of claim 1, wherein the heater includes an inner periphery that encloses a cross-section of the chalcogenide region and physically contacts a longitudinally extending side of the chalcogenide region.

14. The memory of claim 1, wherein the heater extends transversely to the chalcogenide region.

15. The phase change memory of claim 1, wherein the heater is entirely of a resistive metallic material.

16. The phase change memory of claim 15, wherein the resistive metallic material is titanium silicon nitride.

17. A system, comprising:
    a controller;
    a random access memory connected to said controller; and
    phase change memory connected to the controller and including:
        a heater having a sub-lithographic pore extending through the heater, the sub-lithographic pore being defined by an inner wall of the heater; and
        a chalcogenide region extending completely through said pore and having an outer wall that contacts the inner wall of the heater, wherein the heater is configured to supply heat to the chalcogenide region via the inner wall of the heater.

18. The system of claim 17 wherein said phase change memory is a multilevel memory.

19. The system of claim 17, wherein the chalcogenide region includes an upper portion extending above the heater and the phase change memory includes a plurality of sidewall spacer portions contacting opposite sides of the upper portion of said chalcogenide region.

20. The system of claim 17 wherein said heater is planar.

21. The system of claim 17, wherein the phase change memory includes a conductive tube extending under and contacting said heater and an insulating filler extending in said conductive tube.

22. The system of claim 21, wherein the phase change memory includes an address line extending under and electrically coupled to said conductive tube.

23. The system of claim 17 wherein the phase change memory includes an ovonic threshold switch coupled to the chalcogenide region.

24. The system of claim 23 wherein said ovonic threshold switch is over said sub-lithographic pore, and is electrically connected to said chalcogenide region.

25. The system of claim 17, wherein said chalcogenide region is less than 180 nanometers wide.

\* \* \* \* \*